(12) United States Patent
Gunnam (10) Patent No.: US 8,504,900 B2
(45) Date of Patent: Aug. 6, 2013

(54) ON-LINE DISCOVERY AND FILTERING OF TRAPPING SETS

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 293 days.

(21) Appl. No.: 12/829,426

(22) Filed: Jul. 2, 2010

(65) Prior Publication Data

US 2012/0005552 A1    Jan. 5, 2012

(51) Int. Cl.
*H03M 13/00* (2006.01)

(52) U.S. Cl.
USPC .......................... 714/780; 714/785

(58) Field of Classification Search
USPC .......................... 714/794, 780, 785
See application file for complete search history.

(56) References Cited

U.S. PATENT DOCUMENTS

| | | | |
|---|---|---|---|
| 3,755,779 A * | 8/1973 | Price | 714/772 |
| 4,295,218 A | 10/1981 | Tanner | |
| 5,048,060 A * | 9/1991 | Arai et al. | 375/355 |
| 5,721,745 A | 2/1998 | Hladik et al. | |
| 5,734,962 A | 3/1998 | Hladik et al. | |
| 6,023,783 A | 2/2000 | Divsalar et al. | |
| 6,236,686 B1 | 5/2001 | Kamishima | |
| 6,307,901 B1 | 10/2001 | Yu et al. | |
| 6,550,023 B1 * | 4/2003 | Brauch et al. | 714/42 |
| 6,678,843 B2 | 1/2004 | Giulietti et al. | |
| 6,745,157 B1 | 6/2004 | Weiss et al. | |
| 6,760,879 B2 | 7/2004 | Giese et al. | |
| 6,888,897 B1 | 5/2005 | Nazari et al. | |
| 6,910,000 B1 | 6/2005 | Yedidia et al. | |
| 7,143,333 B2 | 11/2006 | Blankenship et al. | |

(Continued)

FOREIGN PATENT DOCUMENTS

| | | |
|---|---|---|
| JP | 2001251384 A | 9/2001 |
| JP | 2005020505 A | 1/2005 |

(Continued)

OTHER PUBLICATIONS

Pusane, A.E.; Costello, D.J.; Mitchell, D.G.M.; , "Trapping set analysis of protograph-based LDPC convolutional codes," Information Theory, 2009. ISIT 2009. IEEE International Symposium on , vol., No., pp. 561-565, Jun. 28, 2009-Jul. 3, 2009.*

(Continued)

*Primary Examiner* — Steve Nguyen
(74) *Attorney, Agent, or Firm* — Mendelsohn, Drucker & Associates, P.C.; Yuri Gruzdkov; Steve Mendelsohn (57) ABSTRACT

A communication system (e.g., a hard drive) having a random-access memory (RAM) for storing trapping-set (TS) information that the communication system generates on-line during a special operating mode, in which low-density parity-check (LDPC)-encoded test codewords are written to a storage medium and then read and decoded to discover trapping sets that appear in candidate codewords produced by an LDPC decoder during decoding iterations. The discovered trapping sets are filtered to select a subset of trapping sets that satisfy specified criteria. The discovery and filtering of trapping sets is performed based on error vectors that are calculated using the a priori knowledge of original test codewords. The TS information corresponding to the selected subset is stored in the RAM and accessed as may be necessary to break the trapping sets that appear in candidate codewords produced by the LDPC decoder during normal operation of the communication system.

18 Claims, 5 Drawing Sheets

(56) References Cited

U.S. PATENT DOCUMENTS

| | | | |
|---|---|---|---|
| 7,181,676 B2 | 2/2007 | Hocevar | |
| 7,219,288 B2 | 5/2007 | Dielissen et al. | |
| 7,237,181 B2 | 6/2007 | Richardson | |
| 7,296,216 B2 | 11/2007 | Shen et al. | |
| 7,340,671 B2 | 3/2008 | Jones et al. | |
| 7,353,444 B2 | 4/2008 | Owsley et al. | |
| 7,457,367 B2 | 11/2008 | Farhang-Boroujeny et al. | |
| 7,689,888 B2 | 3/2010 | Kan et al. | |
| 7,725,800 B2 | 5/2010 | Yang et al. | |
| 7,730,377 B2 | 6/2010 | Hocevar | |
| 7,739,558 B1* | 6/2010 | Farjadrad et al. | 714/704 |
| 7,752,523 B1 | 7/2010 | Chaichanavong et al. | |
| 7,770,090 B1* | 8/2010 | Kons et al. | 714/780 |
| 7,805,642 B1 | 9/2010 | Farjadrad | |
| 7,895,500 B2 | 2/2011 | Sun et al. | |
| 7,904,793 B2 | 3/2011 | Mokhlesi et al. | |
| 7,941,737 B2 | 5/2011 | Gopalakrishnan et al. | |
| 7,949,927 B2 | 5/2011 | Park et al. | |
| 8,010,869 B2 | 8/2011 | Wehn et al. | |
| 8,020,070 B2* | 9/2011 | Langner et al. | 714/758 |
| 8,037,394 B2 | 10/2011 | Djurdjevic et al. | |
| 8,046,658 B2 | 10/2011 | Heinrich et al. | |
| 8,051,363 B1 | 11/2011 | Liu | |
| 8,103,931 B2 | 1/2012 | Wang et al. | |
| 8,127,209 B1* | 2/2012 | Zhang et al. | 714/780 |
| 8,151,171 B2 | 4/2012 | Blanksby | |
| 8,156,409 B2 | 4/2012 | Patapoutian et al. | |
| 8,161,345 B2 | 4/2012 | Graef | |
| 8,616,345 | 4/2012 | Graef | |
| 8,171,367 B2 | 5/2012 | Gao et al. | |
| 8,205,134 B2 | 6/2012 | Harrison et al. | |
| 8,205,144 B1 | 6/2012 | Yadav | |
| 8,214,719 B1 | 7/2012 | Sheng et al. | |
| 8,219,878 B1* | 7/2012 | Varnica et al. | 714/758 |
| 8,255,763 B1 | 8/2012 | Yang et al. | |
| 8,301,984 B1 | 10/2012 | Zhang et al. | |
| 2002/0062468 A1 | 5/2002 | Nagase et al. | |
| 2002/0166095 A1 | 11/2002 | Lavi et al. | |
| 2005/0132260 A1 | 6/2005 | Kyung et al. | |
| 2005/0193320 A1 | 9/2005 | Varnica et al. | |
| 2005/0204255 A1 | 9/2005 | Yeh et al. | |
| 2005/0283707 A1 | 12/2005 | Sharon et al. | |
| 2006/0013306 A1 | 1/2006 | Kim et al. | |
| 2006/0036928 A1 | 2/2006 | Eroz et al. | |
| 2006/0107181 A1 | 5/2006 | Dave et al. | |
| 2006/0115802 A1 | 6/2006 | Reynolds | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0089019 A1 | 4/2007 | Tang et al. | |
| 2007/0124652 A1 | 5/2007 | Litsyn et al. | |
| 2007/0147481 A1 | 6/2007 | Bottomley et al. | |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0234178 A1 | 10/2007 | Richardson et al. | |
| 2007/0234184 A1 | 10/2007 | Richardson | |
| 2008/0049869 A1 | 2/2008 | Heinrich et al. | |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastras-Montano | |
| 2008/0235561 A1 | 9/2008 | Yang | |
| 2008/0276156 A1 | 11/2008 | Gunnam et al. | |
| 2008/0301517 A1 | 12/2008 | Zhong | |
| 2008/0301521 A1 | 12/2008 | Gunnam et al. | |
| 2009/0063931 A1 | 3/2009 | Rovini et al. | |
| 2009/0083609 A1 | 3/2009 | Yue et al. | |
| 2009/0132897 A1 | 5/2009 | Xu et al. | |
| 2009/0150745 A1 | 6/2009 | Langner et al. | |
| 2009/0235146 A1 | 9/2009 | Tan et al. | |
| 2009/0259912 A1 | 10/2009 | Djordjevic et al. | |
| 2009/0273492 A1 | 11/2009 | Yang et al. | |
| 2009/0307566 A1 | 12/2009 | No et al. | |
| 2009/0319860 A1 | 12/2009 | Sharon et al. | |
| 2010/0037121 A1 | 2/2010 | Jin et al. | |
| 2010/0042806 A1 | 2/2010 | Gunnam | |
| 2010/0042890 A1 | 2/2010 | Gunnam | |
| 2010/0050043 A1 | 2/2010 | Savin | |
| 2010/0058152 A1 | 3/2010 | Harada | |
| 2010/0088575 A1* | 4/2010 | Sharon et al. | 714/763 |
| 2011/0041029 A1* | 2/2011 | Yedidia et al. | 714/752 |
| 2012/0135285 A1 | 5/2012 | Iwama et al. | |
| 2012/0139074 A1 | 6/2012 | Abe | |

FOREIGN PATENT DOCUMENTS

| | | | |
|---|---|---|---|
| JP | 2005500513 A | 1/2005 | |
| JP | 2007036495 A | 11/2007 | |
| JP | 2009100222 A | 5/2009 | |
| WO | WO03092170 A1 | 11/2003 | |
| WO | WO2004079563 A1 | 9/2004 | |
| WO | WO2007114724 A1 | 10/2007 | |
| WO | WO2008004215 A2 | 1/2008 | |
| WO | 2010019168 A1 | 2/2010 | |
| WO | WO 2010/019168 A1 | 2/2010 | |

OTHER PUBLICATIONS

Laendner, S.; Milenkovic, O.; , "LDPC Codes Based on Latin Squares: Cycle Structure, Stopping Set, and Trapping Set Analysis," Communications, IEEE Transactions on , vol. 55, No. 2, pp. 303-312, Feb. 2007.*

Dehkordi, M.K.; Banihashemi, A.H.; , "An efficient algorithm for finding dominant trapping sets of LDPC codes," Turbo Codes and Iterative Information Processing (ISTC), 2010 6th International Symposium on , vol., No., pp. 444-448, Sep. 6-10, 2010.*

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Richardson, Tom, "Error Floors of LDPC Codes," in Proc. 41st Allerton Conf. on Communication, Control and Computing, Monticello, IL, Oct. 2003, pp. 1426-1435.

Cole, C. A., et al., "Analysis and Design of Moderate Length Regular LDPC Codes with Low Error Floors," in Proc. 40th Conf. Information Sciences and Systems, Princeton, NJ, Mar. 2006, pp. 1-6.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, in Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981,pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Richardson, Tom, "Error Floors of LDPC Codes," Allerton Conf. on Communication, Control and Computing, (Monticello, Illinois), Oct. 2003, pp. 1426-1435.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Sripimanwat, K., "Turbo Code Applications: A Journey From a Paper to Realization", Oct. 26, 2005, Springer, p. 27.

C. A. Cole, S. G. Wilson, E. K. Hall and T. R. Giallorenzi, "A General Method for Finding Low Error Rates of LDPC Codes," http://arxiv.org/abs/cs.IT/0605051.

D. MacKay and M. Postol, "Weaknesses of margulis and ramanujan-margulis low-density parity-check codes," Electronic Notes in Theoretical Computer Science, vol. 74, 2003.

B. Xia and W. E. Ryan, "On importance sampling for linear block codes," Proc. 2003 IEEE International Conference on Communications, vol. 4, pp. 2904-2908, May 2003.

L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.

Casado, V., et al., "Informed Dynamic Scheduling for Belief-Propagation Decoding of LDPC Codes," IEEE International Conference on Communications, Jun. 24-28, 2007, pp. 932-937.

Presman, N., et al., "Efficient Layers-based Schedules for Iterative Decoding of LDPC Codes," IEEE International Symposium on Information Theory, Jul. 6-11, 2008, pp. 1148-1152.

Radosavljevic, P., et al., "Optimized Message Passing Schedules for LDPC Decoding," Conference Record of the Thirty-Ninth Asilomar conference on Signals, Systems and Comptuters, Oct. 28, 2005-Nov. 1, 2005, pp. 591-595.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.

Cavus, E., et al., "Low BER performance estimation of LDPC codes via application of importance sampling to trapping sets," IEEE Transactions on Communications, vol. 57, No. 7, pp. 1886-1888, Jul. 2009.

Koetter, R., et al. "Turbo equalization," Signal Processing Magazine, IEEE, vol. 21, No. 1, pp. 67-80, Jan. 2004.

Ryan, W. E., et al., "Channel Codes: Classical and Modern," Cambridge University Press, 2009, 710 pages.

* cited by examiner

| ts_address | INDEX DATA |
|---|---|
| 0 | 23 |
| 1 | 35 |
| 2 | 45 |
| 3 | 67 |
| 4 | 34 |
| 5 | 46 |
| 6 | 22 |
| 7 | 89 |
| 8 | 92 |
| 9 | 2049 |
| 10 | 2110 |

FIG. 5
500

ON-LINE DISCOVERY AND FILTERING OF TRAPPING SETS

CROSS-REFERENCE TO RELATED APPLICATIONS

The subject matter of this application is related to that of U.S. Patent Application Publication No. 2010/0042806 and International Patent Application Publication No. WO 2010/019168, both of which are incorporated herein by reference in their entirety.

BACKGROUND

1. Field of the Invention

The present invention relates to signal processing and, more specifically but not exclusively, to error-correction encoding and decoding techniques, such as low-density parity-check (LDPC) encoding and decoding.

2. Description of the Related Art

This section introduces aspects that may help facilitate a better understanding of the invention(s). Accordingly, the statements of this section are to be read in this light and are not to be understood as admissions about what is in the prior art or what is not in the prior art.

While processing the output of a channel detector, a low-density parity-check (LDPC) decoder may encounter one or more trapping sets, which prevents the decoder from converging on the correct codeword. A trapping set is a binary vector that represents a sub-graph in a Tanner graph of the corresponding LDPC code and is described by a pair (a, b) of positive integers, where b is the number of unsatisfied checks (USCs) and a is the number of erroneous bit nodes (EBNs) associated with those USCs. It is known that certain trapping sets (often referred to as dominant trapping sets) have a particularly strong influence on the bit-error rate (BER) and error-floor characteristics of the LDPC decoder.

If the output of an LDPC decoder contains a known trapping set, then certain measures can be taken to steer the LDPC decoder away from the trapping set and have it converge on the correct codeword. However, collection, ranking, and evaluation of trapping sets for use in an LDPC decoder are non-trivial and time-consuming tasks. More specifically, for a given LDPC implementation, all possible trapping sets might number in the millions. In addition, the pluralities of dominant trapping sets corresponding to different implementations of the same LDPC code usually differ from one another. For example, research on LDPC-enabled hard drives has shown that trapping sets are influenced by the hard-drive's jitter profile, inter-symbol interference characteristics, and pulse-shaping scheme. Since these attributes can vary not only between hard drives of different manufacturers, but also between different hard drive models from the same manufacturer or even between different production runs of the same model, each hard drive tends to have a unique plurality of dominant trapping sets.

SUMMARY

Disclosed herein are various embodiments of a communication system (e.g., a hard drive), one embodiment of which has a random-access memory (RAM) for storing trapping-set (TS) information that the communication system generates on-line during a special operating mode, in which low-density parity-check (LDPC)-encoded test codewords are written to a storage medium and then read and decoded to discover trapping sets that appear in candidate codewords produced by an LDPC decoder during decoding iterations. The discovered trapping sets are filtered to select a subset of trapping sets that satisfy specified criteria. The discovery and filtering of trapping sets is performed based on error vectors that are calculated using the a priori knowledge of original test codewords. The TS information corresponding to the selected subset is stored in the RAM and accessed as may be necessary to break the trapping sets that appear in candidate codewords produced by the LDPC decoder during normal operation of the communication system. The use of error vectors in the on-line generation of TS information advantageously enables a significant reduction in the complexity of the corresponding hardware and its relatively straightforward incorporation into the read channel of the communication system.

According to another embodiment, provided is a communication system having a decoder, a memory, and a TS filter. The TS filter is adapted to (i) generate TS information based on error vectors corresponding to candidate codewords produced by the decoder in a process of decoding read signals received from a storage medium and (ii) supply the generated TS information for storage in the memory.

According to yet another embodiment, provided is a communication method having the steps of: (A) writing a codeword to a non-transitory machine-readable storage medium; (B) reading the written codeword from the storage medium to produce corresponding read signals; (C) decoding the read signals to produce a plurality of candidate codewords; (D) comparing each of said candidate codewords with a corresponding reference codeword to generate a plurality of error vectors; (E) processing the generated error vectors to generate corresponding TS information; and (F) storing the generated TS information in a machine-readable memory.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

Figure 1:
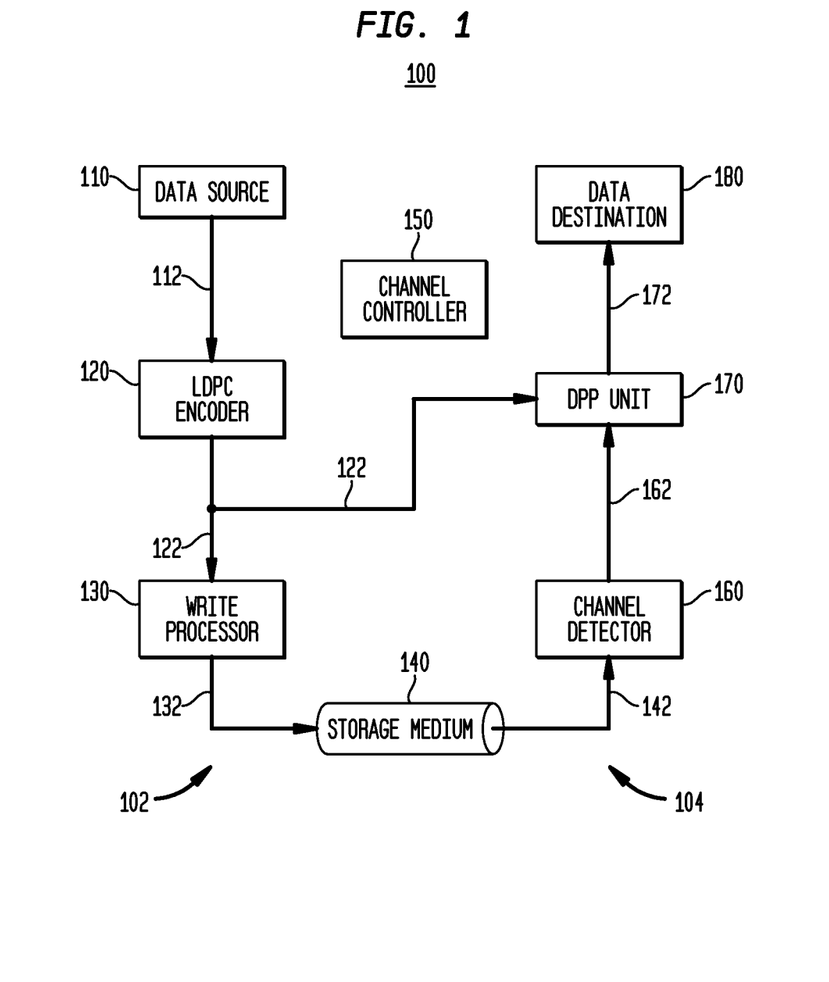
FIG. 1 shows a block diagram of a communication system according to one embodiment of the invention.

FIG. 1 shows a block diagram of a communication system 100 according to one embodiment of the invention. System 100 has a storage medium 140 (e.g., a flash drive, hard-drive platter, etc). Storage medium 140 receives data for storage through a write channel 102 comprising a data source (e.g., input port) 110, a low-density parity-check (LDPC) encoder 120, and a write processor 130. The stored data can be retrieved from storage medium 140 through a read channel 104 comprising a channel detector 160, a decoding and post-processing (DPP) unit 170, and a data destination (e.g., output port) 180. The operations of write channel 102 and read channel 104 are controlled by a channel controller 150. In one embodiment, channel controller 150 is an ARM (Advanced RISC (reduced instruction-set code) Machine) processor.

In operation, data source 110 provides a set of bits 112, often referred to as an original information word, to LDPC encoder 120. LDPC encoder 120 encodes original information word 112 using an LDPC code to generate an original codeword 122, often referred to as the channel-input codeword. LDPC encoding is known in the art and is described in more detail, e.g., in the above-cited International Patent Application Publication No. WO 2010/019168. Original codeword 122 is supplied to write processor 130, which converts it into an appropriate write signal 132 and applies the write signal to storage medium 140. Write signal 132 controllably alters the state of storage medium 140, thereby causing original codeword 122 to be stored in the storage medium.

To retrieve original codeword 122 from storage medium 140, channel detector 160 senses the corresponding location(s) in the storage medium to obtain a read signal 142. Channel detector 160 then converts read signal 142 into a corresponding set of log-likelihood ratio (LLR) values 162 and supplies said LLR values to DPP unit 170. In a typical implementation, an LLR value comprises (i) a sign bit that represents the detector's best guess (hard decision) regarding the bit value stored at the corresponding sensed location in storage medium 140 and (ii) one or more magnitude bits that represent the detector's confidence in the hard decision. In one embodiment, channel detector 160 may output each LLR value as a five-bit value, where the most-significant bit is the sign bit and the four least-significant bits are the confidence bits. For example, a five-bit LLR value of 00000 indicates a hard decision of 0 with minimum confidence, while a five-bit LLR value of 01111 indicates a hard decision of 0 with maximum confidence. Intermediate values (e.g., between 0000 and 1111) of confidence bits represent intermediate confidence levels. Similarly, a five-bit LLR value of 10001 indicates a hard decision of 1 with minimum confidence, while a five-bit LLR value of 11111 indicates a hard decision of 1 with maximum confidence, wherein the binary value of 10000 is unused.

DPP unit 170 performs LDPC decoding on LLR values 162, which, if necessary, is followed by the application of one or more post-processing (PP) methods. More specifically, DPP unit 170 is configured to apply PP methods when the LDPC-decoding process fails, meaning, e.g., that, after the maximum allotted number of decoding iterations, the output word of the LDPC decoder (not explicitly shown in FIG. 1) still has one or more unsatisfied checks (USCs). Depending on the actual number of USCs, DPP unit 170 might (1) send a request to channel controller 150 to have channel detector 160 reread the corresponding location(s) in storage medium 140 and then repeat the decoding process for the newly received LLR values 162 or (2) alter the input of the LDPC decoder and restart the LDPC iterations with the altered input, but without a reread. DPP unit 170 typically uses the first option when the output vector of the failed LDPC decoder has a relatively large number (e.g., more than about sixteen) of USCs. DPP unit 170 typically uses the second option when the output vector of the failed LDPC decoder has a relatively small number of USCs. After the LDPC decoder converges on the correct codeword, DPP unit 170 converts the correct codeword into the corresponding original information word and directs said word, via an output signal 172, to data destination 180.

One of the PP methods that DPP unit 170 may employ under the second option is a so-called list-decoding method, which is described in more detail in the above-cited International Patent Application Publication No. WO 2010/019168. Briefly, the list-decoding method is used for detecting and breaking relatively small trapping sets. More specifically, an observed trapping set in the output word of the failed LDPC decoder is matched against a list of trapping sets that is maintained in a dedicated memory (not shown in FIG. 1) of DPP unit 170. The list of trapping sets may contain the indices of the USCs in each trapping set and the indices of one or more erroneous bit nodes (EBNs) associated with those USCs. If the observed trapping set is found in the memory, then the EBN index value(s) are retrieved from the list. One or more hard-decision values corresponding to these one or more EBNs are flipped or erased, and the corresponding confidence bits are appropriately changed to modify the initial LLR values 162. Then, DPP unit 170 restarts the LDPC decoding process using the modified LLR values as a new input. More often than not, this modification of LLR values will "break" the trapping set(s) and cause the restarted LDPC decoder to converge on the correct codeword.

In one embodiment, the list of trapping sets employed by DPP unit 170 comprises two sub-lists. The first sub-list is stored in a trapping-set read-only memory (TS-ROM) and contains trapping-set (TS) information on the trapping sets that have been discovered off-line using software and/or hardware simulation tools and then loaded into the TS-ROM of DPP unit 170 at the production facility. Representative methods of identifying and recording trapping sets using off-line simulation tools are disclosed, e.g., in the above-cited International Patent Application Publication No. WO 2010/019168. The second sub-list is stored in a TS random-access memory (TS-RAM) of DPP unit 170 and contains TS information on the trapping sets that have been discovered on-line by communication system 100 itself, as further described below in reference to FIGS. 2-5.

In one configuration, communication system 100 can generate TS information for storage in the TS-RAM of DPP unit 170 while operating in a special on-line trapping-set-generating (OLTSG) operating mode. Communication system 100 enters the OLTSG operating mode, e.g., when both write channel 102 and read channel 104 are idle, e.g., not receiving external write and read requests from data source 110 and data destination 180. In effect, the OLTSG operating mode exploits intermittent availability of write channel 102 and read channel 104 to discover and store in the TS-RAM of DPP unit 170 TS information on the trapping sets that is important to the performance characteristics of this particular specimen of communication system 100 but is not stored in the TS-ROM of the DPP unit.

After entering the OLTSG operating mode, write channel 102 is configured to write a sequence of test codewords to storage medium 140 while also directly providing DPP unit 170 with copies of original test codewords 122 of the sequence (see FIG. 1). DPP unit 170 then uses the received copies of original test codewords 122 to discover, evaluate, and selectively store in the TS-RAM any trapping sets that might appear in the output words of the LDPC decoder during failed attempts to recover the original test codewords based on the corresponding LLR values 162 received through read channel 104. When communication system 100 enters the normal operating mode and the list-decoding method is invoked, DPP unit 170 searches both TS-ROM and TS-RAM memories while attempting to break any currently observed trapping set(s). Since the TS-RAM of DPP unit 170 can be used to expand the accessible database of dominant trapping sets, the bit-error rate (BER) and error-floor characteristics of communication system 100 can advantageously be improved compared to the corresponding characteristics of comparable prior-art communication systems.

Figure 2:
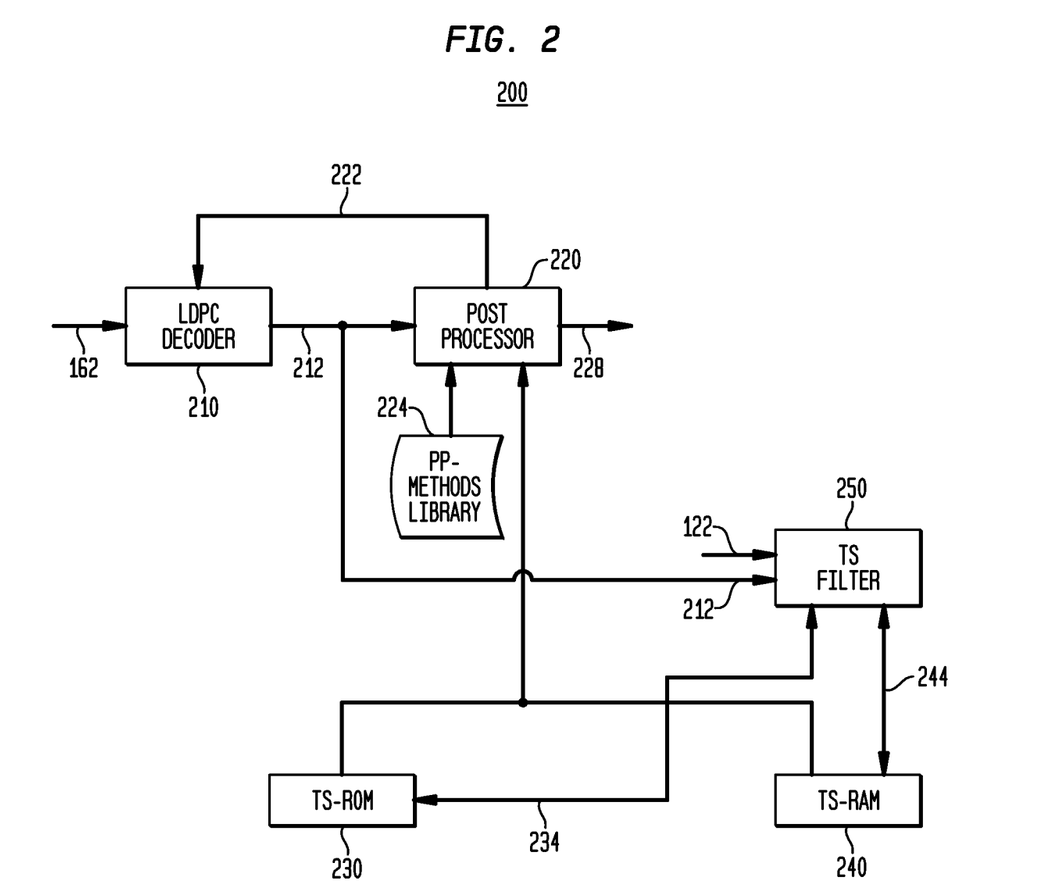
FIG. 2 shows a block diagram of a decoding and post-processing (DPP) unit that can be used in the communication system of FIG. 1 according to one embodiment of the invention.

FIG. 2 shows a block diagram of a DPP unit 200 that can be used as DPP unit 170 according to one embodiment of the invention. DPP unit 200 has an LDPC decoder 210 that receives LLR values 162 from channel detector 160 (see FIG. 1). Decoder 210 performs LDPC decoding on the received LLR values and outputs the decoding results, via a decoder-output signal 212, to a post-processor 220. If decoder-output signal 212 contains a correct codeword, i.e., a codeword that has passed the LDPC syndrome and cyclic-redundancy checks, then post-processor 220 outputs the unaltered decoder-output signal 212 as a post-processor output signal 228. The correct codeword is then used, as known in the art, to compute the corresponding original information word 172 for data destination 180 (FIG. 1). If decoder-output signal 212 does not contain a correct codeword, then post-processor 220 invokes one or more PP methods from a PP-methods library 224, e.g., as indicated above in reference to FIG. 1.

PP-methods library 224 is a memory that contains one or more executable programs representing the corresponding post-processing methods, such as the above-mentioned list-decoding method. If post-processor 220 needs to perform a particular PP method, then the post-processor retrieves the corresponding executable program from PP-methods library 224 and runs that program. If post-processor 220 executes the list-decoding method, then, during the execution, the post-processor may access a TS-ROM 230 and a TS-RAM 240 to find matches to the trapping sets observed in decoder-output signal 212. If a match is found, then DPP unit 200 breaks the trapping set(s), e.g., by (i) using the TS information stored in TS-ROM 230 and/or TS-RAM 240 to identify the EBNs associated with the USCs of decoder-output signal 212; (ii) flipping one or more of the identified EBNs; (iii) communicating to decoder 210, via a feedback signal 222, the corresponding changes that need to be made to LLR values 162; and (iv) configuring decoder 210 to restart the decoding process with the changed LLR values.

As already indicated above, TS-ROM 230 comes from the production facility preloaded with TS information that had been generated off-line. In contrast, TS-RAM 240 comes from the production facility without any TS information stored therein, and the TS information to be stored in the TS-RAM is generated by the corresponding communication system (e.g., communication system 100, FIG. 1) on-line using the above-mentioned OLTSG operating mode. When operating in the OLTSG operating mode, DPP unit 200 uses a TS filter 250 to select from the trapping sets encountered by decoder 210 a subset of trapping sets for storage in TS-RAM 240. More specifically, TS filter 250 uses a copy of original test codeword 122 that it receives from LDPC encoder 120 (see FIG. 1) to calculate an error vector corresponding to candidate codeword 212 and then carries out a trapping-set evaluation and selection process based on said error vector as further described below in reference to FIGS. 3-5. TS filter 250 consults TS-ROM 230, via a communication line 234, to avoid redundancies in the TS information stored in TS-ROM 230 and TS-RAM 240. TS information corresponding to the trapping sets selected by TS filter 250 is transferred, via a communication line 244, to TS-RAM 240 for storage therein and subsequent use, e.g., during the normal operating mode of the communication system.

As used herein, the term "error vector" refers to a binary vector that is produced when an XOR (exclusive OR) function is applied to two binary vectors of equal dimensionality, with the first vector being a correct codeword (e.g., original test codeword 122, FIG. 1) and the second vector being an output word (e.g., candidate codeword 212, FIG. 2) generated by the LDPC decoder in the process of decoding the LLR values (e.g., LLR values 162, FIG. 1) corresponding to the original test codeword. If two corresponding bits of original test codeword 122 and candidate codeword 212 match, then the corresponding bit of the error vector will be zero. If the two corresponding bits do not match, then the corresponding bit of the error vector will be one, indicating an erroneous bit node (EBN). Note that the trapping-set evaluation and selection process implemented in TS filter 250 differs from prior-art TS-filtering methods at least in that the latter rely on trapping-set indices and not on error vectors. This reliance causes the hardware for implementing prior-art TS-filtering methods to be relatively complex and not suitable for on-line TS filtering. In contrast, the use of error vectors in the trapping-set evaluation and selection process of TS filter 250 enables the corresponding hardware to be advantageously less complex, which makes said hardware amenable to on-line TS filtering and incorporation into a read channel of the corresponding communication system (e.g., read channel 104 of communication system 100, FIG. 1).

For each failed decoding operation corresponding to a test codeword, e.g., when LDPC decoder 210 fails to converge on the original test codeword within the maximum allotted number of iterations, TS filter 250 records all observed trapping sets. TS filter 250 then narrows the list of recorded trapping sets down to a relatively small subset, e.g., consisting of five to sixteen trapping sets, that meet certain specified criteria. Hereafter, this relatively small subset of trapping sets is referred to as the "filtered subset of trapping sets."

After a filtered subset of trapping sets is generated, TS filter 250 may transfer some or all the TS information corresponding to the subset to TS-RAM 240. TS filter 250 does not transfer TS information to TS-RAM 240 if (1) either the TS-RAM or TS-ROM 230 already has said TS information and/or (2) the TS-RAM is full and the corresponding trapping set has a lower rank than any of the trapping sets whose TS information is stored in the TS-RAM. Different trapping sets can be ranked based on Hamming weight, the number of USCs, the number of EBNs, the frequency of occurrence, and estimated influence on the BER, e.g., as disclosed in the above-cited International Patent Application Publication No. WO 2010/019168. If TS-RAM 240 is full but one or more trapping sets from the filtered subset of trapping sets have a higher rank than one or more of the trapping sets whose TS information is stored in the TS-RAM, then one or more of the lower-ranked trapping sets may be deleted from the TS-RAM to make space for the one or more new higher-ranked trapping sets.

In one embodiment, TS filter 250 compiles a record corresponding to the filtered subset of trapping sets by selecting trapping sets of three different types. The first type is referred to as "stable" trapping sets. A stable trapping set is a trapping set that appears in the output word of LDPC decoder 210 in a specified number (e.g., three) of consecutive iterations. The second type is referred to as "transient" trapping sets. A transient trapping set is a trapping set that appears in the output word of LDPC decoder 210 in at least one iteration, but does not appear in the iteration that immediately follows the one in which it has appeared. The third type is referred to as "minimum-weight" trapping sets. As the name implies, a minimum-weight trapping set is one of the trapping sets that has a minimum Hamming weight (i.e., the number of bits in the corresponding error vector having a value of one) within the corresponding plurality of trapping sets. TS filter 250 may compile a record corresponding to the filtered subset of trapping sets by identifying and selecting no more than $N_1$ unique stable trapping sets, no more than $N_2$ unique transient trapping sets, and no more than $N_3$ unique minimum-weight trapping sets, where $N_1$, $N_2$, and $N_3$ are positive integers. In one configuration, $N_1=5$, $N_2=5$, and $N_3=1$. In an alternative configuration, $N_1$, $N_2$, and $N_3$ can be all different from one another.

It should be understood that the three above-indicated types of trapping sets represent mere examples of the filtering criteria that can be implemented in TS filter 250. One skilled in the art will appreciate that other filtering criteria can be similarly implemented in TS filter 250. Such other filtering criteria may differ from the above-described ones, e.g., by the number and/or types of trapping sets selected for the filtered subset of trapping sets by TS filter 250.

Figure 3:
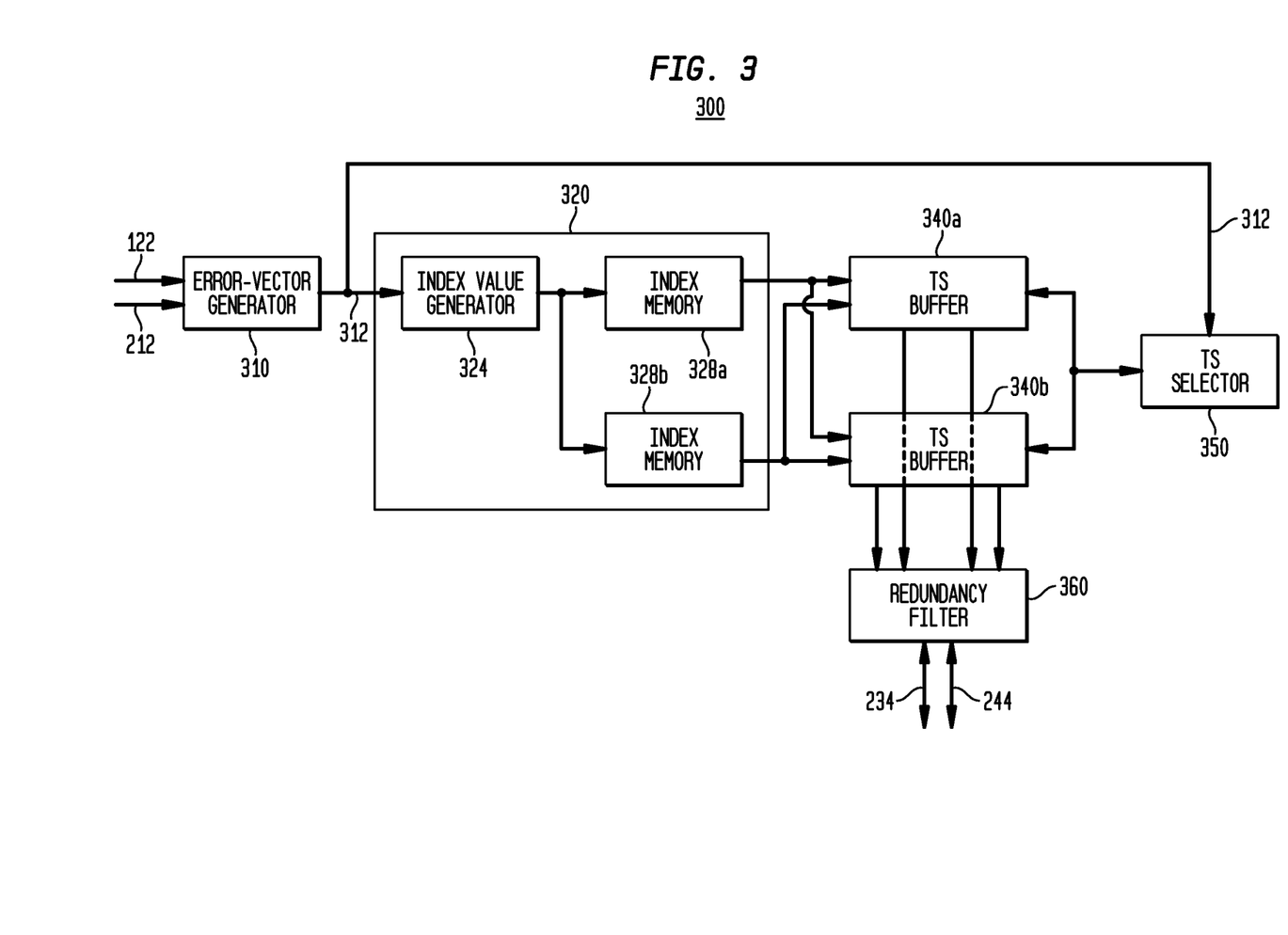
FIG. 3 shows a block diagram of a trapping-set (TS) filter that can be used in the DPP unit of FIG. 2 according to one embodiment of the invention.

FIG. 3 shows a block diagram of a TS filter 300 that can be used as TS filter 250 according to one embodiment of the invention. TS filter 300 has an error-vector generator 310 that receives (i) original test codeword 122 from LDPC encoder 120 (FIG. 1) and (ii) the corresponding candidate codeword 212 from LDPC decoder 210 (FIG. 2). Error-vector generator 310 applies a bit-by-bit XOR function to these codewords to generate an error vector 312, which is supplied to an indexing module 320 and to a TS selector 350. Indexing module 320 is coupled to TS buffers 340a-b, which are themselves coupled to both TS selector 350 and a redundancy filter 360 as indicated in FIG. 3. Redundancy filter 360 is connected to communication lines 234 and 244 that couple TS filter 300 to TS-ROM 230 and TS-RAM 240, respectively (also see FIG. 2). Redundancy filter 360 uses communication lines 234 and 244 to check whether any of the trapping sets in the filtered set of trapping sets are redundant with respect to the trapping sets whose TS information is already stored in TS-ROM 230 and TS-RAM 240. Communication line 244 is further used by TS filter 300 to transfer non-redundant TS information from TS buffers 340a-b to TS-RAM 240.

As already indicated above, a list-decoding method is used for detecting and breaking relatively small trapping sets. An error vector corresponding to a small trapping set will have mostly zeros and very few ones. For example, for a representative codeword length of 5088, typical error vector 312 will have fewer than about sixteen "one" bits, which is less than about 0.4% of the total number of bits in the vector. This property of error vector 312 makes it amenable to fast indexing processing, which is implemented in indexing module 320.

Indexing module 320 has an index-value generator 324 that generates index values for the "one" bits of error vector 312 in a manner disclosed in the above-cited U.S. Patent Application Publication No. 2010/0042806. Each set of index values generated by index-value generator 324 is provided to one of index memories 328a-b. In one embodiment, each index memory 328 comprises M (e.g., =8) separate memory banks in a semi-parallel arrangement (not explicitly shown) that enables the index memory to receive or output M index values per clock cycle. Together, index memories 328a-b act in a "ping-pong" fashion, meaning that sets of M index values can be received and sent by the index memories in an alternating fashion. Thus, when index values are being written into index memory 328a by index-value generator 324, index memory 328b can output its index values to one of TS buffers 340a-b. Similarly, when index values are being written into index memory 328b by index-value generator 324, index memory 328a can output its index values to one of TS buffers 340a-b. Additional details on the organization of index memories 328a-b and the ping-pong functionality can be found in the above-cited U.S. Patent Application Publication No. 2010/0042806.

TS buffers 340a-b are similarly configured to operate in a ping-pong fashion with respect to receiving data from indexing module 320 and sending data to redundancy filter 360 or TS filter 350. The ping-pong functionality of indexing module 320 and TS buffers 340a-b increases, at the expense of additional hardware, the data throughput between TS filter 300 and TS-RAM 240 (FIG. 2) compared to that in a system without such functionality. One skilled in the art will appreciate that, in an alternative embodiment, TS filter 300 can be modified to have a single index memory 328 and a single TS buffer 340, and operate without the ping-pong functionality at the expense of having a lower data throughput than the embodiment shown in FIG. 3.

Figure 4:
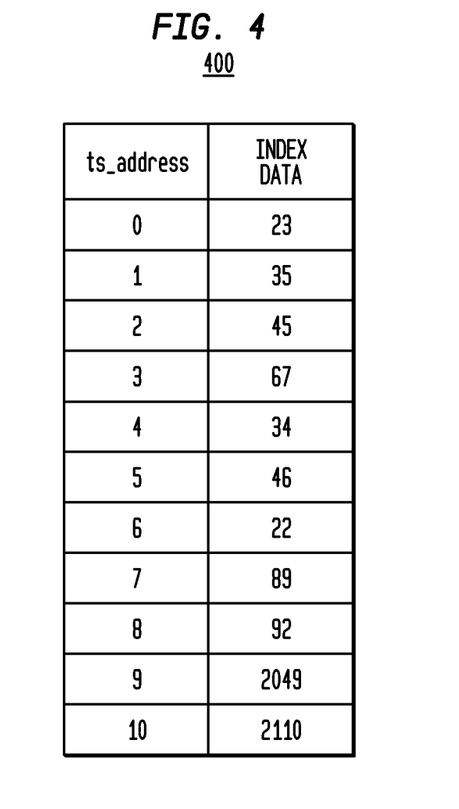
FIG. 4 shows a table that illustrates data organization in a TS buffer of the TS filter shown in FIG. 3 according to one embodiment of the invention.

FIG. 4 shows a table 400 that illustrates data organization in TS buffer 340 according to one embodiment of the invention. More specifically, table 400 shows how index data for three exemplary trapping sets (TS1, TS2, and TS3) can be stored in TS buffer 340. Trapping set TS1 has a Hamming weight of four, and the four indices of this trapping set are 23, 35, 45, and 67. Trapping set TS2 has a Hamming weight of two, and the two indices of this trapping set are 34 and 46. Trapping set TS3 has a Hamming weight of five, and the five indices of this trapping set are 22, 89, 92, 2049, and 2110.

As can be seen in FIG. 4, TS buffer 340 stores trapping sets consecutively, in the order in which they are presented to the TS buffer by indexing module 320, with each index being stored at a separate address. At the end of a failed LDPC decoding operation, TS buffer 340 contains all trapping sets that have arisen during the different iterations of that failed decoding operation, stored in the format indicated by table 400. To retrieve indices of any particular trapping set from TS buffer 340, the following two parameters need to be specified: (i) the address (shown in column ts_address of table 400) of the first index of that trapping set and (ii) the Hamming weight (w) of that trapping set. For example, trapping set TS1 can be retrieved from TS buffer 340 having the contents shown in table 400 by specifying ts_address=0 and w=4. Similarly, trapping set TS2 can be retrieved by specifying ts_address=4 and w=2; and trapping set TS3 can be retrieved by specifying ts_address=6 and w=5.

Referring back to FIG. 3, TS selector 350 uses (i) a sequence of error vectors 312 generated during a failed LDPC decoding operation and (ii) a set of specified selection criteria to identify trapping sets for the corresponding filtered set of trapping sets. As already indicated above, a representative set of selection criteria may be designed for selecting no more than $N_1$ unique stable trapping sets, no more than $N_2$ unique transient trapping sets, and no more than $N_3$ unique minimum-weight trapping sets per failed LDPC decoding operation. The TS identification process implemented by TS selector 350 results in a compilation of a list of first-index addresses (e.g., positions 0, 4, and 6 in column ts_address of table 400, FIG. 4) and weights w of the trapping sets selected by the TS selector for the filtered set of trapping sets. When said list is compiled, TS selector 350 configures TS buffers 340a-b to transfer the corresponding index data (see column Index Data in table 400, FIG. 4) from the TS buffers to TS-RAM 240 (FIG. 2). The transfer is performed via redundancy filter 360, which may block some of the index data from being transferred to TS-RAM 240, e.g., if the redundancy filter determines that the corresponding TS information is already stored in TS-ROM 230 or TS-RAM 240.

Figure 5:
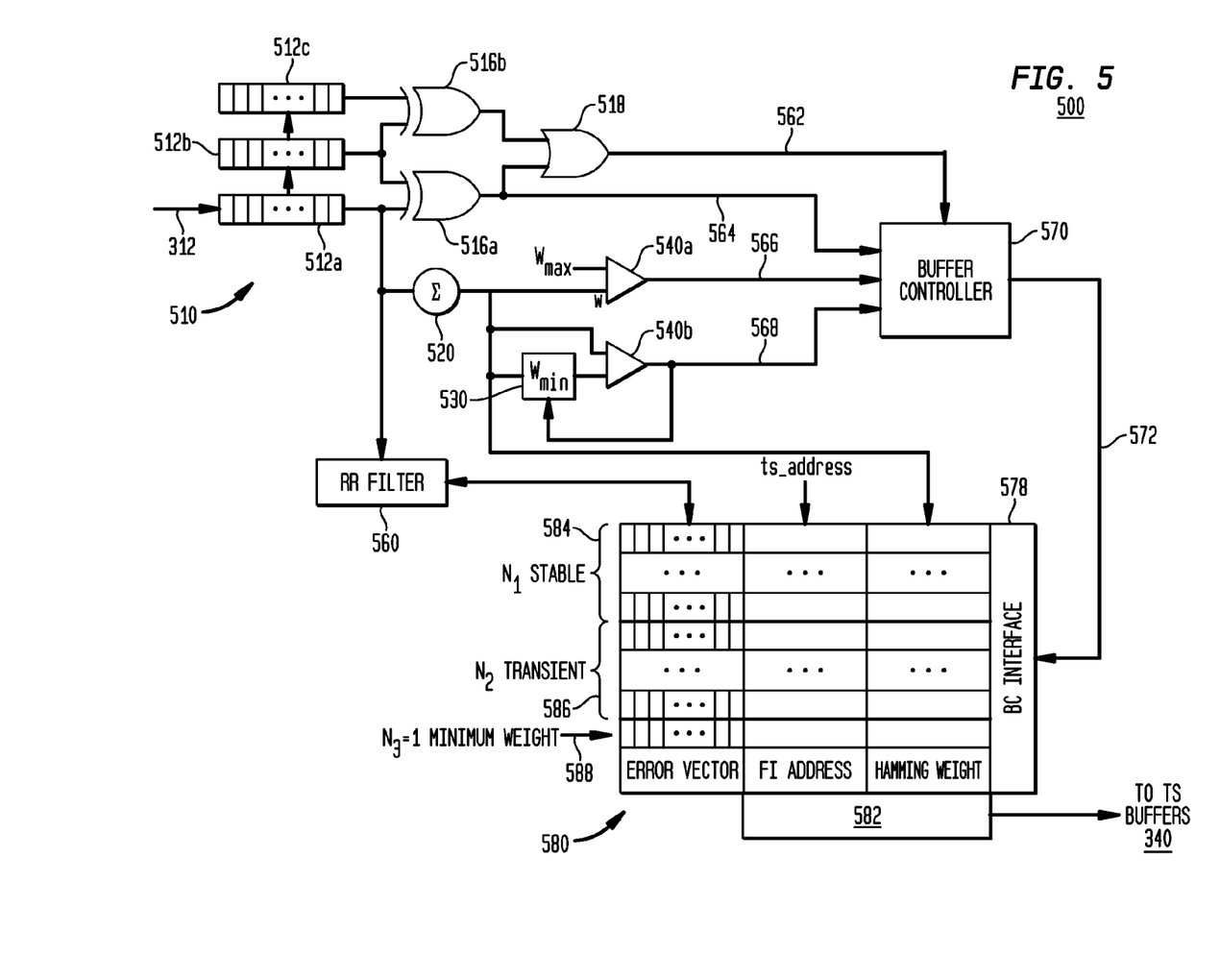
FIG. 5 shows a block diagram of a TS selector that can be used in the TS filter shown in FIG. 3 according to one embodiment of the invention.

FIG. 5 shows a block diagram of a TS selector 500 that can be used as TS selector 350 according to one embodiment of the invention. TS selector 500 has a TS-identification information (TSIDI) buffer 580 that is used for compiling a record of identification (ID) information corresponding to the trapping sets selected for the filtered set of trapping sets. More specifically, TSIDI buffer 580 is configured to store the error vectors, first-index (FI) addresses, and Hamming weights for a maximum of $N_1$ stable trapping sets, $N_2$ transient trapping sets, and $N_3=1$ minimum-weight trapping set. The FI addresses and Hamming weights stored in TSIDI buffer 580 are then used to configure TS buffers 340a-b, via an output interface 582, to transfer the corresponding index data to TS-RAM 240.

The record of ID information stored in TSIDI buffer 580 is compiled under the control of a buffer controller 570. Buffer controller 570 uses indicator signals 562, 564, 566, and 568 to identify the trapping sets whose ID information is to be stored in TSIDI buffer 580. Buffer controller 570 generates a control signal 572 that configures TSIDI buffer 580, via a buffer/controller (BC) interface 578, to store the ID information corresponding to the selected trapping sets.

Indicator signal 562 is a stability-check flag that indicates whether or not error vector 312 has remained unchanged for the last three iterations of the LDPC decoder. More specifically, indicator signal 562 is (i) binary zero when the error vector has remained unchanged for the last three iterations and (ii) binary one when the error vector has changed at least one time during the last three iterations. Indicator signal 562 is generated by processing the error vectors stored in a memory stack 510 having three error-vector (EV) buffers 512a-c, each having a size corresponding to the size of error vector 312. After each iteration of the LDPC decoder, EV buffer 512a receives the corresponding error vector 312 from error-vector generator 310 (FIG. 3). The error vector that was previously stored in EV buffer 512a (if any) is shifted up to EV buffer 512b. The error vector that was previously stored in EV buffer 512b (if any) is shifted up to EV buffer 512c. The error vector that was previously stored in EV buffer 512c (if any) is discarded. Thus, except for the first two iterations, EV buffers 512a-c contain the three most-recent error vectors. After the first iteration, EV buffer 512a contains the first error vector, and EV buffers 512b-c are initialized by writing binary "ones" into all positions. After the second iteration, EV buffers 512a-b contain the second and first error vectors, respectively, and EV buffer 512c still has all binary "ones."

The error vectors stored in EV buffers 512a-c are compared with one another using XOR gates 516a-b. More specifically, XOR gate 516a performs a bit-by-bit comparison of the error vectors stored in EV buffers 512a-b. XOR gate 516b similarly performs a bit-by-bit comparison of the error vectors stored in EV buffers 512b-c. If the two error vectors that are being compared by XOR gate 516 differ in at least one bit, then the XOR gate outputs a binary one. Alternatively, if the two error vectors are identical, then XOR gate 516 outputs a binary zero. The outputs of XOR gates 516a-b are fed into an OR gate 518 that produces indicator signal 562.

Indicator signal 564 is a variability-check flag that indicates whether or not current error vector 312 has changed in the last iteration. More specifically, indicator signal 564 is (i) binary zero when the error vector has not changed in the last iteration and (ii) binary one when the error vector has changed. Indicator signal 564 is generated by XOR gate 516a as already described above.

Indicator signal 566 is a maximum-weight flag that indicates whether or not the Hamming weight of current error vector 312 exceeds a specified maximum weight, $w_{max}$, of interest. More specifically, indicator signal 566 is (i) binary zero when the Hamming weight of error vector 312 does not exceed $w_{max}$ and (ii) binary one when the Hamming weight exceeds $w_{max}$. Indicator signal 566 is generated using a summation circuit 520 and a comparator 540a. Summation circuit 520 calculates Hamming weight w of the error vector stored in EV buffer 512a by calculating the bit sum of that vector. Comparator 540a generates indicator signal 566 by comparing w with $w_{max}$.

Indicator signal 568 is a minimum-weight flag that indicates whether or not the Hamming weight of the current error vector 312 has a minimum weight among the error vectors received by TS selector 500 in all previous iterations of the ongoing LDPC decoding operation. More specifically, indicator signal 568 is (i) binary zero when the Hamming weight of error vector 312 is a minimum weight and (ii) binary one when the Hamming weight is not a minimum weight. Indicator signal 568 is generated by a comparator 540b that compares Hamming weight w calculated by summation circuit 520 with a value, $w_{min}$, stored in a minimum-weight register 530. Minimum-weight register 530 is initialized by storing therein maximum weight $w_{max}$ and then updated after each LDPC iteration using indicator signal 568. For example, if indicator signal 568 is binary zero, then the value that is currently stored in minimum-weight register 530 is replaced by Hamming weight w received from summation circuit 520. If indicator signal 568 is binary one, then the value stored in minimum-weight register 530 is left unchanged.

ID information corresponding to error vector 312 stored in EV buffer 512a may be provisionally selected, based on indicator signals 562, 564, 566, and 568 and subject to a redundancy/rank (RR) check that is further described below, for storage in one of three areas 584, 586, and 588 of TSIDI buffer 580. Area 584 is allotted for storing the ID information corresponding to $N_1$ stable trapping sets. Area 586 is allotted for storing the ID information corresponding to $N_2$ transient trapping sets. Area 588 is allotted for storing the ID information corresponding to one minimum-weight trapping set. ID information is provisionally selected for storage in area 584 only if both indicator signals 562 and 566 are zero. ID information is provisionally selected for storage in area 586 only if indicator signal 564 is one and indicator signal 566 is zero. ID information is provisionally selected for storage in area 588 only if indicator signal 568 is zero.

If ID information is provisionally selected for storage in the corresponding area of TSIDI buffer 580 based on indicator signals 562, 564, 566, and 568, then an RR filter 560 performs a corresponding redundancy/rank check to make a final decision on whether or not the provisionally selected ID information should be stored in the TSIDI buffer. The redundancy portion of the RR check performed by RR filter 560 comprises verifying the uniqueness of the error vector stored in EV buffer 512a with respect to the error vectors that are already stored in TSIDI buffer 580 (if any). The provisionally selected ID information is stored in the corresponding area of TSIDI buffer 580 only if the redundancy check is satisfied, i.e., the error vector stored in EV buffer 512a is unique.

The rank portion of the RR check is performed by RR filter 560 only if the corresponding area of TSIDI buffer 580 is full and one of the entries therein needs to be deleted to make room for the one or more new entries. The provisionally selected ID information is stored in the corresponding area of TSIDI buffer 580 only if the corresponding trapping set has a higher rank than at least one of the trapping sets whose ID information is already stored in the TSIDI buffer. The TS ranking criteria implemented in RR filter 560 may include one or more of the Hamming weight of the trapping set, the number of iterations in which the trapping set has appeared during the LDPC decoding operation, the latest iteration in which the trapping set has appeared, etc. For example, a smaller Hamming weight usually corresponds to a higher rank. Higher frequency of occurrence also corresponds to a higher rank. A higher rank is usually assigned to a trapping set that appears in a later iteration of the LDPC decoding operation.

If both the redundancy portion and rank portion (when applicable) of the RR check performed by RR filter 560 are satisfied, then the provisionally selected ID information is stored in the corresponding area of TSIDI buffer 580. If necessary, the ID information corresponding to a lower-ranked trapping set is deleted from TSIDI buffer 580 to make room for the new entry. The Error-Vector field of the new entry receives the error vector from EV buffer 512a. The FI-Address field of the new entry receives the ts_address value corresponding to the first index of the trapping set from TS buffers 340a-b (FIG. 3). The Hamming-Weight field of the new entry receives the value of w from summation circuit 520. At the end of a failed LDPC decoding operation, TSIDI buffer 580 contains the ID information (e.g., the ts_address values of the first indices and the Hamming weights of the selected trapping sets) that enables TS selector 500 to properly configure TS buffers 340a-b to transfer the corresponding index data to TS-RAM 240 (FIG. 2).

As used herein, the term "test codeword" refers to an original codeword generated by the encoder (e.g., LDPC encoder 120, FIG. 1) and communicated to the decoder (e.g., DPP unit 170, FIG. 1) to enable the decoder to compare the original codeword with the decoding results that the decoder obtains by decoding read signals produced by the read channel (e.g., read channel 104, FIG. 1) while reading the original codeword from the storage medium (e.g., storage medium 140, FIG. 1), after the original codeword has been written to the storage medium by the write channel (e.g., write channel 102, FIG. 1). Test codewords can be generated by the write channel, e.g., based on random or pseudo-random original information words (e.g., information words 112, FIG. 1). Test codewords have the same overall characteristics as regular codewords and differ from the latter only in that they are communicated directly to the decoder by the encoder. In contrast, regular codewords are not communicated directly to the decoder by the encoder and are decoded solely based on the read signals that the read channel produces while reading those regular codewords from the storage medium.

As used herein, the term "candidate codeword" refers to an output word generated by the decoder (e.g., LDPC decoder 210, FIG. 2) in a process of decoding read signals (e.g., LLR values 162, FIG. 1) supplied to the decoder by the read channel (e.g., read channel 104, FIG. 1). In each decoding iteration, the decoder produces a corresponding candidate codeword. If the candidate codeword passes the syndrome and cyclic-redundancy checks, then it is deemed to be a correct codeword that is identical to the original codeword written by the write channel (e.g., write channel 102, FIG. 1) to the storage medium (e.g., storage medium 140, FIG. 1). Otherwise, the candidate codeword has USCs and EBNs, and may also have one or more trapping sets.

Although various embodiments of the present invention are described above in reference to the use of a direct communication line between the encoder and decoder that bypasses the storage medium for providing the decoder with the original codeword, the invention is not so limited. In alternative embodiments, other methods and/or arrangements can be used to provide the decoder with the correct original codeword. As an example, two representative alternative embodiments are described below. Based on this description, one skilled in the art will be able to devise additional alternative embodiments without departing from the scope and principles of the present invention.

Referring back to FIG. 1, in one alternative embodiment, both LDPC encoder 120 and DPP unit 170 can have the same reference list of codewords, e.g., generated by each of them using the same deterministic algorithm. At a convenient time, e.g., when write channel 102 is idle, LDPC encoder 120 may configure write processor 130 to write some or all codewords from the reference list to specified locations in storage medium 140. At another convenient time, e.g., when read channel 104 is idle, channel detector 160 may access those specified locations to obtain the corresponding read signals 142 and provide DPP unit 170 with the corresponding LLR values 162. DPP unit 170 can then generate TS information for the TS-RAM as described above, while using its own copy of the reference list of codewords, in lieu of encoder signal 122, for generating error vectors.

In another alternative embodiment, DPP unit 170 can obtain the correct codeword for use in lieu of encoder signal 122 by invoking a PP method other than the list-decoding method, as long as the invoked PP method does not need a direct input from LDPC encoder 120. One such PP method, referred to as targeted bit flipping, is disclosed in U.S. Patent Application Publication No. 2010/0042890, which is incorporated herein by reference in its entirety. Once the invoked PP method produces the correct codeword, DPP unit 170 can proceed to generate TS information for the TS-RAM as described above, while using the correct codeword, in lieu of encoder signal 122, for generating error vectors. One skilled in the art will appreciate that this particular embodiment can be used in normal real-time operation of communication system 100, e.g., when sufficient data-processing resources are available to accommodate targeted bit flipping, as targeted bit flipping is relatively computationally intensive.

As used herein, the term "reference codeword" refers to a correct codeword that enables the decoder (e.g., DPP unit 170, FIG. 1) to calculate error vectors for the decoding results that the decoder obtains by decoding read signals produced by the read channel (e.g., read channel 104, FIG. 1) while reading the corresponding original codeword from the storage medium (e.g., storage medium 140, FIG. 1), after the original codeword has been written to the storage medium by the write channel (e.g., write channel 102, FIG. 1). In one implementation, a reference codeword can be a test codeword, as the term "test codeword" defined above. In another implementation, a reference codeword can be a codeword from a reference list of codewords, which reference list is described above. In yet another implementation, a reference codeword can be a correct codeword obtained by the decoder through the application of one or more appropriate post-processing methods, such as the above-mentioned targeted bit flipping.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

The various embodiments of the present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, or general-purpose computer.

Certain aspects of the present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they formally fall within the scope of the claims.

What is claimed is:

1. A communication system, comprising:
    a decoder;
    a memory; and
    a trapping-set filter adapted to (i) generate trapping-set information based on one or more error vectors corresponding to one or more candidate codewords produced by the decoder in a process of decoding a first set of read signals corresponding to a first codeword stored in a storage medium and (ii) supply the generated trapping-set information for storage in the memory; and
    wherein the system is configured to access the generated trapping-set information in the memory to break a trapping set encountered by the decoder in a process of decoding a second set of read signals corresponding to a second codeword stored in the storage medium.

2. The system of claim 1, wherein the trapping-set filter comprises an error-vector generator adapted to generate the one or more error vectors, wherein each error vector is generated by applying an exclusive OR function to the first codeword and a corresponding candidate codeword produced by the decoder, wherein the first codeword is a reference codeword.

3. The system of claim 2, wherein the error-vector generator is configured to receive the first codeword from an encoder via a path that bypasses the storage medium.

4. The system of claim 2, wherein the error-vector generator is configured to obtain the first codeword from a reference list of codewords, wherein both an encoder and the trapping-set filter possess respective copies of said reference list.

5. The system of claim 2, further comprising a post-processor operatively coupled to the decoder and configured to (i) recover the first codeword based on the candidate codeword and (ii) supply the recovered first codeword to the error-vector generator for the exclusive OR function.

6. The system of claim 2, wherein the trapping-set filter further comprises:
    an indexing module adapted to process the one or more error vectors generated by the error-vector generator to generate index data corresponding to trapping sets encountered by the decoder in the process of decoding the read signals;
    a trapping-set buffer adapted to store the index data generated by the indexing module; and
    a trapping-set selector adapted to identify a subset of the index data for transfer from the trapping-set buffer to the memory as part of the generated trapping-set information.

7. The system of claim 1, wherein, for each failed decoding operation, the trapping-set filter is configured to generate trapping-set information corresponding to a maximum of $N_1$ stable trapping sets, $N_2$ transient trapping sets, and $N_3$ minimum-weight trapping sets, where $N_1$, $N_2$, and $N_3$ are predetermined positive integers.

8. The system of claim 1, wherein the memory comprises:
    a trapping-set read-only memory that is loaded with off-line-generated trapping-set information; and
    a trapping-set random-access memory adapted to store the generated trapping-set information supplied by the trapping-set filter.

9. The system of claim 1, further comprising:
    an encoder adapted to encode original information words to generate corresponding channel-input codewords;

a write processor adapted to convert the channel-input codewords into corresponding write signals and apply said write signals to the storage medium; and a channel detector adapted to sense the storage medium to obtain the read signals, convert the read signals into corresponding sets of log-likelihood-ratio values, and supply said log-likelihood-ratio values to the decoder, wherein the decoder is adapted to recover the codewords stored in the storage medium based on said log-likelihood-ratio values and the generated trapping-set information supplied to the memory by the trapping-set filter.

10. The system of claim 9, wherein:

the encoder is a Low-Density Parity Check encoder;

the decoder is a corresponding Low-Density Parity Check decoder; and the storage medium is a hard-disk platter.

11. A communication system, comprising:

a decoder;

a memory; and a trapping-set filter adapted to (i) generate trapping-set information based on error vectors corresponding to candidate codewords produced by the decoder in a process of decoding read signals received from a storage medium and (ii) supply the generated trapping-set information for storage in the memory, wherein the trapping-set filter comprises an error-vector generator adapted to generate the error vectors, wherein each error vector is generated by applying an exclusive OR function to a reference codeword and a corresponding candidate codeword produced by the decoder; and wherein the error-vector generator is configured to obtain the reference codeword from a reference list of codewords, wherein both an encoder and the trapping-set filter possess respective copies of said reference list.

12. A communication system, comprising:

a decoder;

a memory; and a trapping-set filter adapted to (i) generate trapping-set information based on error vectors corresponding to candidate codewords produced by the decoder in a process of decoding read signals received from a storage medium and (ii) supply the generated trapping-set information for storage in the memory, wherein the trapping-set filter comprises:

an error-vector generator adapted to generate the error vectors, wherein each error vector is generated by applying an exclusive OR function to a reference codeword and a corresponding candidate codeword produced by the decoder;

an indexing module adapted to process the error vectors generated by the error-vector generator to generate index data corresponding to trapping sets encountered by the decoder in the process of decoding the read signals;

a trapping-set buffer adapted to store the index data generated by the indexing module; and a trapping-set selector adapted to identify a subset of the index data for transfer from the trapping-set buffer to the memory as part of the generated trapping-set information.

13. The system of claim 12, wherein the trapping-set selector is adapted to identify said subset of the index data based on the error vectors generated by the error-vector generator.

14. The system of claim 12, wherein the trapping-set selector comprises a plurality of serially connected error-vector buffers, wherein:

a first error-vector buffer of the plurality is configured to receive an error vector from the error-vector generator; and each of one or more additional error-vector buffers of the plurality is configured to receive an error vector previously stored in the error-vector buffer that immediately precedes that additional error-vector buffer in the series.

15. The system of claim 14, wherein the trapping-set selector further comprises:

a logic circuit adapted to process the error vectors stored in the plurality of error-vector buffers to generate a plurality of indicator signals; and a trapping-set-identification-information buffer adapted to receive and store identification information that identifies the subset of the index data, wherein the trapping-set selector is adapted to generate said identification information based on the plurality of indicator signals.

16. The system of claim 12, wherein the trapping-set filter further comprises a redundancy filter adapted to prevent trapping-set information already stored in the memory from being transferred from the trapping-set buffer to the memory.

17. The system of claim 12, wherein the indexing module comprises a first index memory and a second index memory, each adapted to store index data corresponding to a trapping set encountered by the decoder in one iteration of the decoding process, wherein:

the first index memory is configured to transfer index data stored therein to the trapping-set buffer while the second index memory is receiving different index data being generated by the indexing module, and vice versa.

18. The system of claim 12, wherein the trapping-set buffer comprises a first buffer portion and a second buffer portion, wherein:

the first buffer portion is configured to transfer a subset of the index data stored therein to the memory while the second buffer portion is receiving different index data from the indexing module, and vice versa.

* * * * *